(12) United States Patent
Kuniyasu

(10) Patent No.: US 7,061,166 B2
(45) Date of Patent: Jun. 13, 2006

(54) LAMINATED STRUCTURE AND METHOD OF MANUFACTURING THE SAME

(75) Inventor: Toshiaki Kuniyasu, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/846,588

(22) Filed: May 17, 2004

(65) Prior Publication Data

US 2004/0251784 A1 Dec. 16, 2004

(30) Foreign Application Priority Data

May 27, 2003 (JP) .............................. 2003-149377

(51) Int. Cl.
*H01L 41/083* (2006.01)

(52) U.S. Cl. ...................... 310/365; 310/364; 310/366; 310/328

(58) Field of Classification Search ........ 310/364–366, 310/325; 29/25.35
See application file for complete search history.

(56) References Cited

U.S. PATENT DOCUMENTS 4,845,399 A * 7/1989 Yasuda et al. .............. 310/366
6,066,911 A * 5/2000 Lindemann et al. ... 310/323.02
6,172,447 B1* 1/2001 Ishikawa et al. ............ 310/359
6,912,761 B1* 7/2005 Yasugi et al. ............... 29/25.35
2002/0130595 A1* 9/2002 Seipler et al. ............... 310/366
2004/0113526 A1* 6/2004 Kirjavainen ................ 310/328
2004/0251784 A1* 12/2004 Kuniyasu .................... 310/328

FOREIGN PATENT DOCUMENTS

JP 2002-118305 A 4/2002

* cited by examiner

*Primary Examiner*—Darren Schuberg
*Assistant Examiner*—J. Aguirrechea
(74) *Attorney, Agent, or Firm*—Sughrue Mion, PLLC

(57) ABSTRACT

A laminated structure in which interconnections can be easily formed for electrodes and in which the damage of an insulating layer attributed to stress is relieved. The laminated structure includes a laminated piece having a first electrode layer provided with a first insulating region, a piezoelectric material layer, and a second electrode layer provided with a second insulating region at a position different from that of the first insulating region, a first interconnection line electrically connected to the first electrode layer while passing through the second insulating region provided in the second electrode layer, and a second interconnection line electrically connected to the second electrode layer while passing through the first insulating region provided in the first electrode layer.

13 Claims, 14 Drawing Sheets

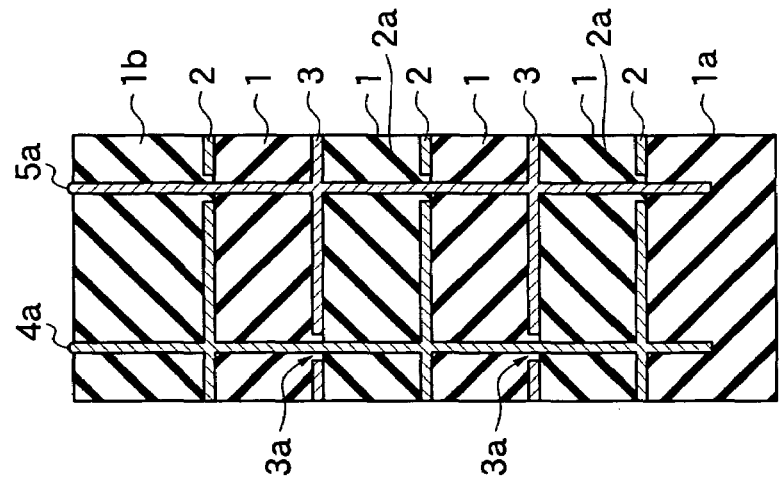
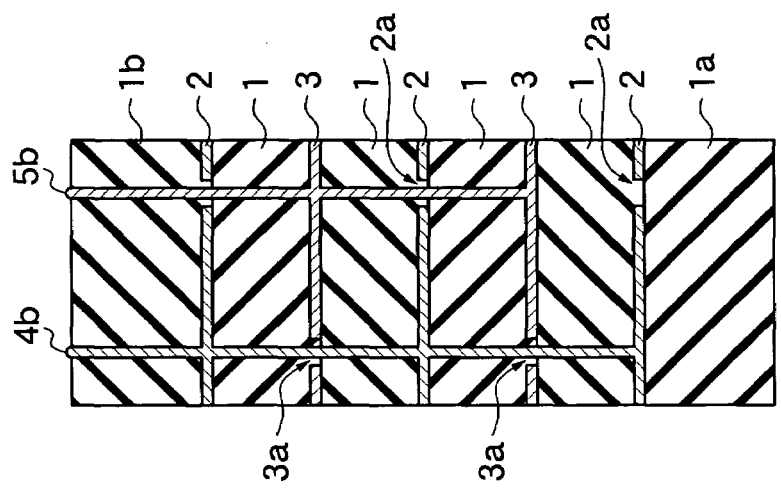
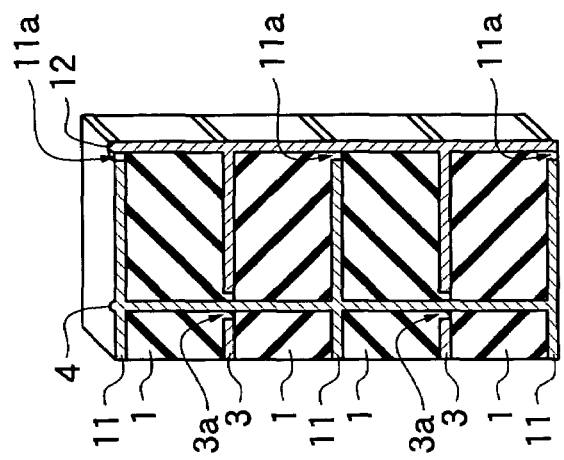

10

LAMINATED STRUCTURE AND METHOD OF MANUFACTURING THE SAME

BACKGROUND OF THE INVENTION

1. Field of the Invention

The present invention relates to a laminated structure in which insulator layers and electrode layers are alternately stacked, and a method of manufacturing the laminated structure.

2. Description of a Related Art

Laminated structures in each of which insulator (dielectric) layers and electrode layers are alternately formed, are utilized, not only in laminated capacitors, but also in various other uses such as piezoelectric pumps, piezoelectric actuators and ultrasonic transducers. In recent years, with the developments of devices and equipment concerning MEMS (microelectromechanical systems), elements each having such a laminated structure have been microfabricated still further and packaged more highly.

In the microfabrication of an element which has opposing electrodes, decrease in the area of the element lowers the capacitance between the electrodes, so that the problem of rise in the electric impedance of the element occurs. When the electric impedance rises in, for example, a piezoelectric actuator, the impedance matching between the piezoelectric actuator and a signal circuit for driving this piezoelectric actuator cannot be established, and it becomes difficult to feed power to the piezoelectric actuator so that the performance of the piezoelectric actuator degrades. Further, in an ultrasonic transducer employing a piezoelectric element, the detection sensitivity for an ultrasonic wave degrades. For those reasons, in order to enlarge the capacitance between the electrodes while microfabricating the element, it has been practiced to alternately stack a plurality of piezoelectric material layers and a plurality of electrode layers. Thus, the capacitance between the electrodes of the whole element can be enlarged by connecting the plurality of stacked layers in parallel.

In such a laminated structure, interconnections are formed from the side surfaces of the laminated structure in order to connect the plurality of electrode layers to one another. FIG. 14 is a sectional view for explaining a conventional interconnection method for a laminated structure. The laminated structure 100 includes a plurality of piezoelectric material layers 101, a plurality of electrodes 102 and 103, and side electrodes 104 and 105. Each of the electrodes 102 and 103 is so formed that its one end extends to one wall surface of the laminated structure. Thus, the electrodes 102 are connected with the side electrode 104 and are insulated from the side electrode 105. Besides, the electrodes 103 are connected with the side electrode 105 and are insulated from the side electrode 104. A potential difference is afforded between the side electrode 104 and the side electrode 105, whereby the piezoelectric material layers 101 arranged between the electrodes 102 and the electrodes 103 are expanded or contracted by the piezoelectric effect.

Meanwhile, as shown in FIG. 14, insulating regions 106 where no electrodes are formed are provided in juxtaposition with the electrodes 102 and 103 in order to insulate these electrodes from the side electrodes 105 and 104, respectively. Unlike the other regions of the piezoelectric material layer 101, each of the insulating regions 106 is not expanded or contracted even when a voltage is applied between the electrode 102 and the electrode 103. This results in the problem that the part 106 undergoes stress concentration and is liable to damage.

As another interconnection method in a laminated structure, Japanese Patent Application Laid-open JP-P2002-118305A (p. 1, FIG. 1) discloses an interconnection method for a multi-electrode piezoelectric device with a piezoelectric/electrostrictive material, having a large number of electrodes which are individually controlled, comprising the steps of coating with an insulating material, part or all of an electric circuit board or an electronic circuit board in which the electrodes for external connections are formed on a surface of the piezoelectric/electrostrictive material, and removing the insulating material coated on desired electrodes for external connections to form interconnection patterns on the surface of the desired electrodes, thereby establishing conductions between interconnection lines and the desired electrodes. With such a method, however, it is complicated to form the interconnections for a large number of arrayed laminated structures, respectively. Especially in the case where laminated structures are arrayed in two dimensions, it is difficult to form the interconnections.

SUMMARY OF THE INVENTION

The present invention has been made in view of such problems. An object of the present invention is to provide a laminated structure in which insulating layers are less liable to damage due to stress, and in which interconnections can be easily formed for electrodes.

In order to accomplish the object, a laminated structure according to a first view of the present invention comprises: a laminated piece having a plurality of piezoelectric material layers and a plurality of electrode layers stacked in a predetermined sequence, the plurality of electrode layers including a first electrode layer provided with a first insulating region and a second electrode layer provided with a second insulating region at a position different from that of the first insulating region; a first interconnection line electrically connected to the first electrode layer while passing through the second insulating region provided in the second electrode layer; and a second interconnection line electrically connected to the second electrode layer while passing through the first insulating region provided in the first electrode layer.

Further, a laminated structure according to a second view of the present invention comprises: a plurality of laminated pieces arrayed in two dimensions, each of the plurality of laminated pieces having a plurality of piezoelectric material layers and a plurality of electrode layers stacked in a predetermined sequence, the plurality of electrode layers including a first electrode layer provided with a first insulating region and a second electrode layer provided with a second insulating region at a position different from that of the first insulating region; a first plurality of interconnection lines each electrically connected to the first electrode layer while passing through the second insulating region provided in the second electrode layer; and a second plurality of interconnection lines each electrically connected to the second electrode layer while passing through the first insulating region provided in the first electrode layer.

Besides, a method of manufacturing a laminated structure according to the first view of the present invention comprises: the steps of: (a) forming a laminated piece by stacking a plurality of piezoelectric material layers and a plurality of electrode layers in a predetermined sequence, the plurality of electrode layers including a first electrode layer provided with a first insulating region and a second electrode layer provided with a second insulating region at a position different from that of the first insulating region; (b) forming at least one through-hole to penetrate the first electrode layer while passing through the second insulating region provided in the second electrode layer; (c) forming at least one through-hole to penetrate the second electrode layer while passing through the first insulating region provided in the first electrode layer; and (d) filling up the through-holes formed at steps (b) and (c) with a metal material to form at least one interconnection line electrically connected to the first electrode layer and at least one interconnection line electrically connected to the second electrode layer.

Further a method of manufacturing a laminated structure according to the second view of the present invention comprises the steps of: (a) forming a laminated piece by stacking a plurality of piezoelectric material layers and a plurality of electrode layers in a predetermined sequence, the plurality of electrode layers including a first electrode layer provided with a first group of insulating regions and a second electrode layer provided with a second group of insulating regions at positions different from those of the first group of insulating regions; (b) forming a plurality of through-holes to penetrate the first electrode layer while respectively passing through the second group of insulating regions provided in the second electrode layer; (c) forming a plurality of through-holes to penetrate the second electrode layer while respectively passing through the first group of insulating regions provided in the first electrode layer; (d) filling up the pluralities of through-holes formed at steps (b) and (c) with a metal material to form a plurality of interconnection lines electrically connected to the first electrode layer and form a plurality of interconnection lines electrically connected to the second electrode layer; (e) forming at least one trench in the laminated piece to partially divide the laminated piece; and (f) packing an insulating material into the at least one trench formed at step (e).

Furthermore, a method of manufacturing a laminated structure according to a third viewpoint of the present invention comprises the steps of: (a) forming a laminated piece by stacking a plurality of piezoelectric material layers and a plurality of electrode layers in a predetermined sequence, the plurality of electrode layers including a first electrode layer provided with a first group of insulating regions and a second electrode layer provided with a second group of insulating regions at positions different from those of the first group of insulating regions; (b) forming at least one trench in the laminated piece to partially divide the laminated piece; (c) packing an insulating material into the at least one trench formed at step (b); (d) forming a plurality of through-holes to respectively pass through boundaries between the insulating material and the divided first electrode layers and boundaries between the insulating material and the second group of insulating regions provided in the divided second electrode layers; (e) forming a plurality of through-holes to respectively pass through boundaries between the insulating material and the divided second electrode layers and boundaries between the insulating material and the first group of insulating regions provided in the divided first electrode layers; and (f) filling up the pluralities of through-holes formed at steps (d) and (e) with a metal material to form a plurality of interconnection lines electrically connected to the divided first electrode layers respectively and form a plurality of interconnection lines electrically connected to the divided second electrode layers respectively.

According to the present invention, the areas of the insulating regions which are provided in the electrode layers can be made small, so that the damage of the piezoelectric material layer attributed to the concentration of stress on the insulating region can be relieved. Moreover, the electrode layers can be connected by forming the through-holes from the top surface of the laminated piece in which the piezoelectric material layers and the electrode layers are stacked, and then filling up the through-holes with the metal material, so that interconnections can be easily formed even in laminated structures which are arrayed in two dimensions.

BRIEF DESCRIPTION OF THE DRAWINGS

FIGS. 2A–2C are sectional views showing modifications of the laminated structure according to the first embodiment of the present invention;

DESCRIPTION OF THE PREFERRED EMBODIMENTS

Figure 1A:
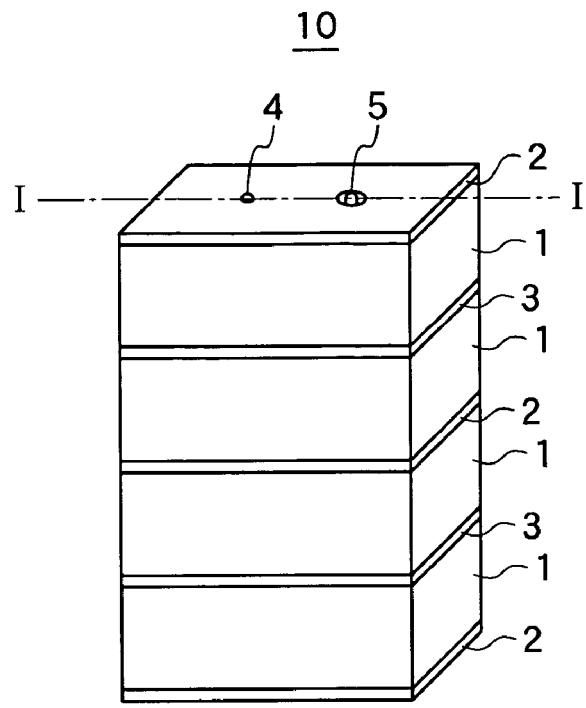
FIG. 1A is a perspective view and FIG. 1B is a sectional view both showing a laminated structure according to the first embodiment of the present invention.

Now, embodiments of the present invention will be described in detail with reference to the drawings. Incidentally, identical reference numerals and signs are assigned to the same constituents, the explanation of which shall be omitted from description.

Figure 1B:
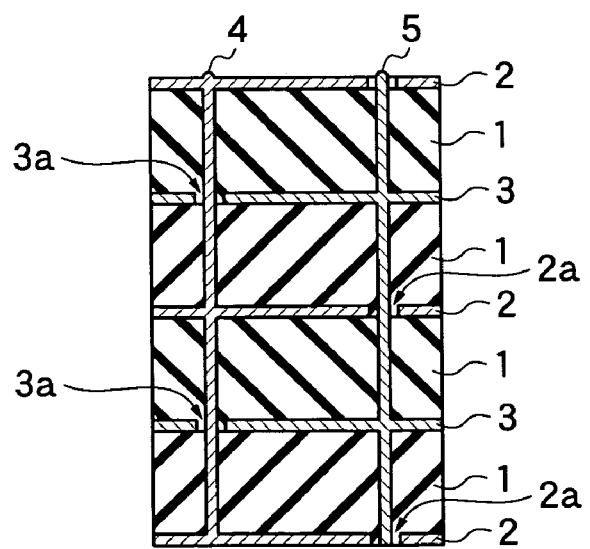

FIG. 1A is a schematic view showing the construction of a laminated structure according to the first embodiment of the present invention, while FIG. 1B is a sectional view taken along I—I in FIG. 1A. As shown in FIG. 1A, the laminated structure 10 is, for example, a minute pillar-like structure having a bottom surface, which has a side of about 0.3–1.0 mm, and a height of about 1.0 mm. This laminated structure 10 includes a plurality of PZT (Pb (lead) zirconate titanate) layers 1, a plurality of first electrode layers 2, a plurality of second electrode layers 3, and vertical interconnection lines 4 and 5.

The PZT layers 1 are respectively arranged between the first electrode layers 2 and the second electrode layers 3. A voltage is applied between the first electrode layers 2 and the second electrode layers 3, whereby the PZT layers 1 are expanded or contracted by the piezoelectric effect. Such a laminated structure employing a piezoelectric material such as PZT or the like for insulating layers (dielectric layers) is applied to, for example, a piezoelectric pump, a piezoelectric actuator, or an ultrasonic transducer which transmits and receives ultrasonic waves in an ultrasonic probe Besides, the structure having such a laminated construction can increase the area of opposing electrodes more than a structure of single layer, so that it can lower an electrical impedance. Accordingly, it operates more efficiently for an applied voltage as compared with the structure of single layer.

As shown in FIG. 1B, at least one insulating region 2a is provided within the plane of each first electrode layer 2. In this application, the "insulating region" signifies a region where an electrode material has been removed in the first electrode layer 2. Likewise, at least one insulating region 3a is provided within the plane of each second electrode layer 3. The insulating region 2a and the insulating region 3a are arranged at positions different from each other, in the planes of respectively corresponding electrode layers.

Each of the vertical interconnection lines 4 and 5 is a fine interconnection line having a diameter of, for example, about 30 μm or less, desirably 20 μm or less. The vertical interconnection lines 4 and 5 are formed in such a way that fine holes are formed so as to penetrate individual lamination planes included in the laminated structure 10, from the top surface of this laminated structure 10, and that the fine holes are filled up with an electrode material such as a metal material. Here, the vertical interconnection lines 4 and 5 need not be strictly vertical to the respective lamination planes. The vertical interconnection line 4 is formed so as to penetrate the PZT layers 1 and the first electrode layers 2, and to pass through the insulating regions 3a in the second electrode layers 3. Besides, the vertical interconnection line 5 is formed so as to penetrate the PZT layers 1 and the second electrode layers 3, and to pass through the insulating regions 2a in the first electrode layers 2. Owing to such an arrangement of the vertical interconnection lines 4 and 5, the plurality of first electrode layers 2 are connected in parallel by the vertical interconnection line 4 and are insulated from the vertical interconnection line 5. Likewise, the plurality of second electrode layers 3 are connected in parallel by the vertical interconnection line 5 and are insulated from the vertical interconnection line 4.

Here, the areas of the insulating regions 2a and 3a are made small to such an extent that the vertical interconnection lines 4 and 5 are prevented from coming into contact with the electrode portions around the insulating regions 2a and 3a. By way of example, a diameter of each of the insulating regions 2a and 3a should desirably be set at, at most, double that of each of the vertical interconnection lines 4 and 5.

FIGS. 2A–3C are sectional views and perspective views showing modifications of the laminated structure according to the above embodiment.

FIG. 2A shows the modification in which PZT layers 1a and 1b are respectively disposed at the lowermost layer and uppermost layer of the laminated structure shown in FIG. 1B. When the lowermost layer or the uppermost layer or both the lowermost and uppermost layers is provided as the PZT layer (s) in this manner, the electrode layer (s) can be protected. For the purpose of the protective function, each of the PZT layers 1a and 1b should desirably be thicker than each PZT layer 1 arranged between the first electrode layer 2 and the second electrode layer 3.

Regarding the length of each of vertical interconnection lines, the vertical interconnection lines 4a and 5a may penetrate the PZT layer 1a, or they may well extend to an intermediate part of the PZT layer 1a as shown in FIG. 2A. Alternatively, the vertical interconnection line 4a or 5a may well extend down to the electrode layer 2 or 3 to which it is to be connected, as shown in FIG. 2B.

In this embodiment, insulating regions can be provided at desired positions within the planes of the corresponding electrode layers. By way of example, in FIG. 2C, the insulating regions 11a are provided at the end portions of the corresponding electrode layers 11, whereby one vertical interconnection line 12 extends along the edge of the laminated structure. When the insulating regions are arranged at the end portions of the electrode layers in this manner, the area of each of the insulating regions can be made smaller. In this modification, the insulating regions which are provided in ones of the first electrode layers and the second electrode layers are arranged at the end portions of the corresponding electrode layers, but insulating regions in both the first and second electrode layers may well be arranged at the end portions of the respectively corresponding electrode layers.

Figure 3A:
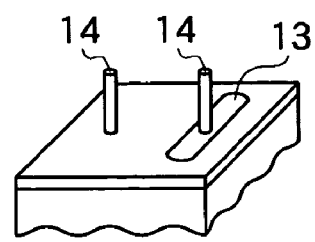
FIGS. 3A–3C are perspective views and a sectional view showing other modifications of the laminated structure according to the first embodiment of the present invention.
Figure 3B:
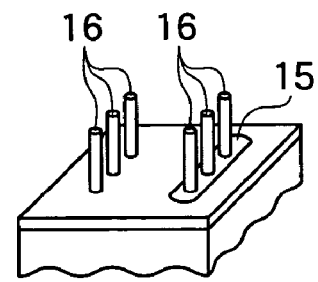

In this embodiment, the shape of each of the insulating regions which are provided in the laminated structure is not restricted to a circle. It is possible to employ, for example, an ellipse as in an insulating region 13 shown in FIG. 3A, or any other desired shape. Besides, the cross-sectional shape of a vertical interconnection line 14 is not restricted to a circle, but an ellipse or any other desired shape may well be employed in accordance with the shape of the insulating region. Further, a plurality of vertical interconnection lines 16 may well be disposed in a single insulating region 15 as shown in FIG. 3B. When the shape and number of the vertical interconnection lines are regulated in this manner, the vertical interconnection line and the respective electrode layers can be brought into reliable contact.

Figure 3C:
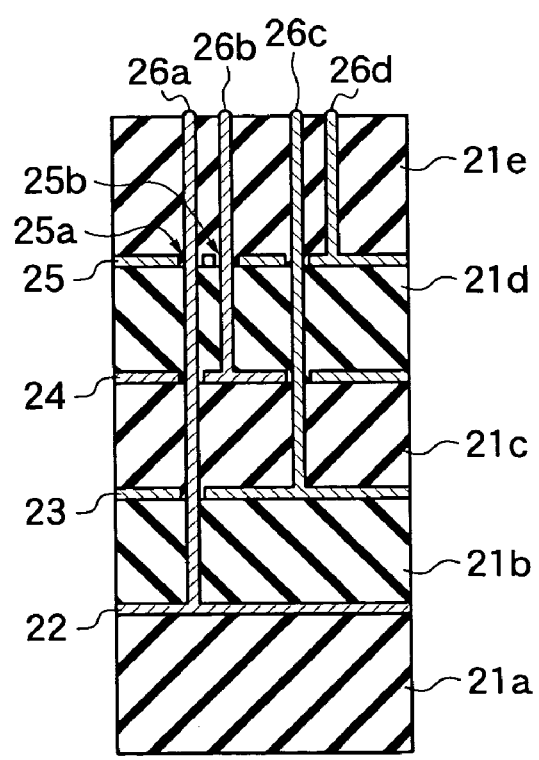

Moreover, in this embodiment, one insulating region need not always correspond to one electrode layer, but the numbers of insulating regions and vertical interconnection lines may well be increased as may be needed. By way of example, a plurality of vertical interconnection lines 26a and 26b having different lengths are respectively connected to electrode layers 22 and 24 as shown in FIG. 3C. Likewise, a plurality of vertical interconnection lines 26c and 26d having different lengths are respectively connected to electrode layers 23 and 25. In such a laminated structure, PZT layers to be operated can be altered by changing-over switches which are connected to the vertical interconnection lines 26a–26d. By way of example, the PZT layer 21b is operated by affording a potential difference between the vertical interconnection lines 26a and 26c. Besides, the PZT layers 21b–21d are operated by affording a potential difference between the vertical interconnection lines 26a and 26d. When the number and positions of the insulating regions and the positions and lengths of the vertical interconnection lines are altered in this manner, the desired one(s) of the PZT layers are permitted to generate the piezoelectric effect.

Figure 4:
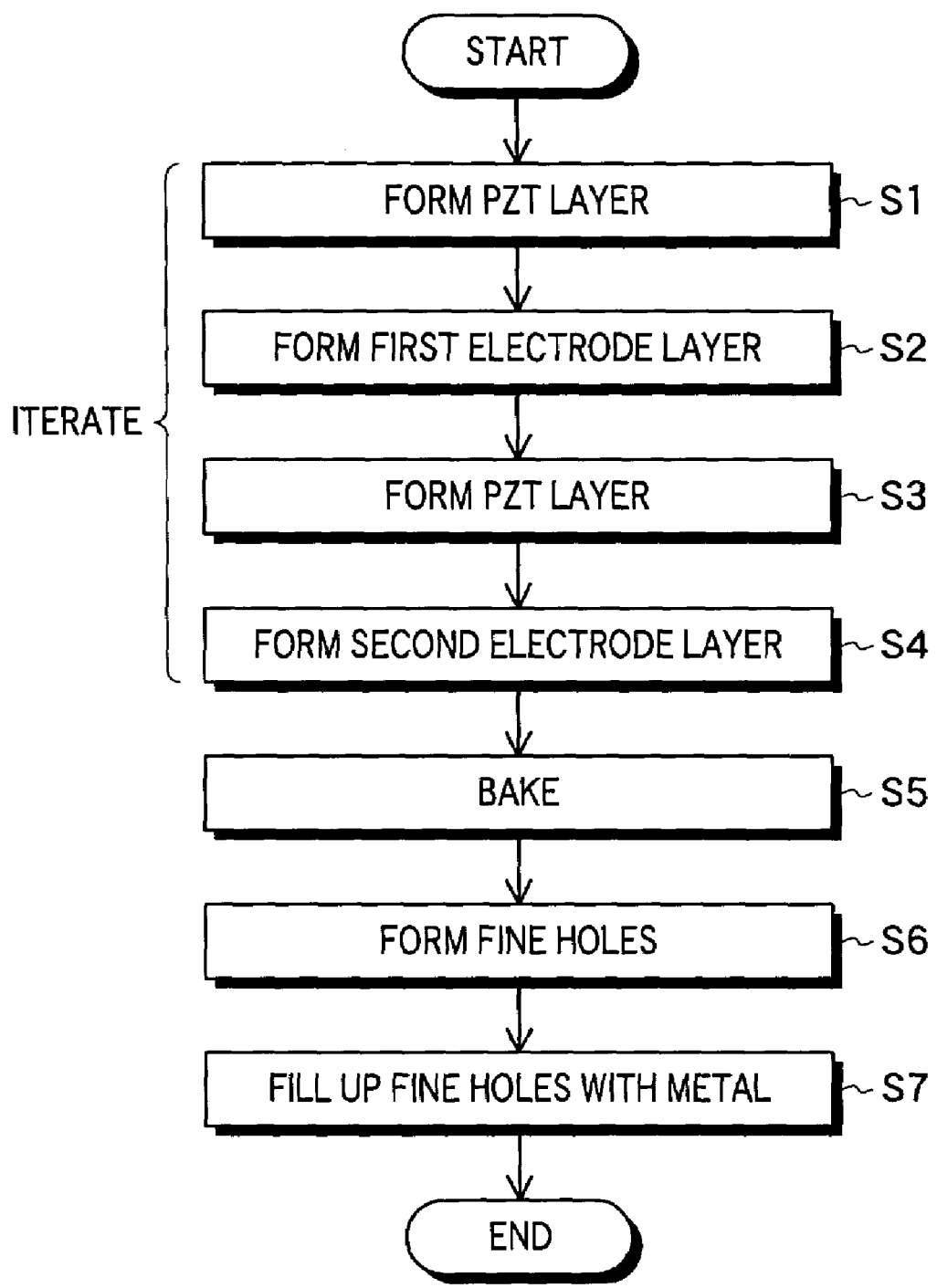
FIG. 4 is a flow chart showing a method of manufacturing the laminated structure according to the first embodiment of the present invention.

Next, a method of manufacturing the laminated structure according to the first embodiment of the present invention will be described with reference to FIG. 4 to FIGS. 6A and 6B. FIG. 4 is a flow chart showing the manufacturing method for the laminated structure according to this embodiment. Besides, FIGS. 5A–6B are views for explaining the manufacturing method for the laminated structure according to this embodiment.

Figure 5A:
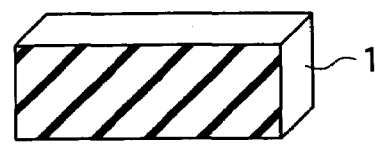
FIGS. 5A–5E are views for explaining the manufacturing method for the laminated structure according to the first embodiment of the present invention.

At step S1 in FIG. 4, a PZT layer 1 is formed as shown in FIG. 5A. Although the PZT layer 1 is formed in accordance with a green sheet method in this embodiment, it may well be formed in accordance with another known method.

Figure 5B:
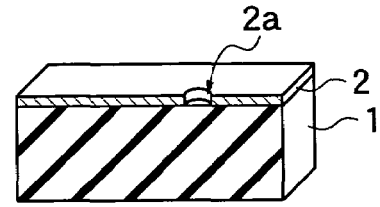

Subsequently, at step S2, a first electrode layer 2 is formed on the region of the PZT layer 1 except for an insulating region 2a, as shown in FIG. 5B, in accordance with a known film formation method such as sticking or screen printing. As the material of the first electrode layer 2, a refractory metal material including a metal or an alloy should desirably be employed in consideration of the temperature of baking which will proceed at a later step. Mentioned as such a material is, for example, nickel (Ni), silver-palladium (Ag—Pd), or platinum (Pt).

Figure 5C:
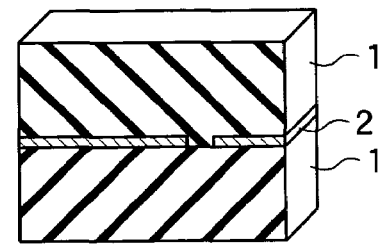
Figure 5D:
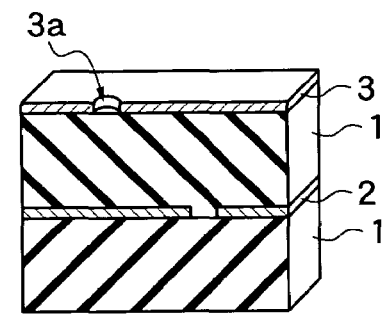

At step S3, a PZT layer 1 is formed on the first electrode layer 2, as shown in FIG. 5C. On that occasion, the insulating region 2a provided in the first electrode layer 2 is also filled up with PZT. At the next step S4, a second electrode layer 3 is formed on the region of the PZT layer 1 except an insulating region 3a, as shown in FIG. 5D. Incidentally, film formation methods and materials which are employed at steps S3 and S4 are respectively the same as explained at steps S1 and S2.

Figure 5E:
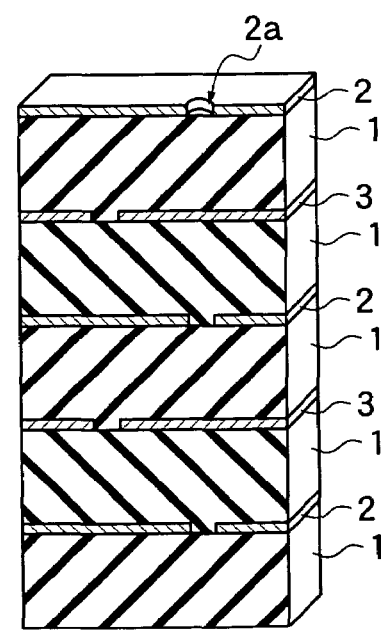

The steps S1–S4 are iterated a desired number of times, whereby a laminated piece as shown in FIG. 5E is formed. Here, the uppermost layer of the laminated piece maybe the electrode layer, as shown in FIG. 5E, or it may well be the PZT layer. In the case where the uppermost layer is provided as the PZT layer, it can be employed as a protective layer for the electrodes. Besides, in the case where the uppermost layer is provided as the electrode layer, an insulating material may well be disposed in and around the insulating region 2a in order to insulate the electrode layer from a vertical interconnection line which will be formed at a later step.

Subsequently, at step S5, the laminated piece shown in FIG. 5E is baked under pressure in an atmosphere of, for example, 800° C. to 1000° C. Thus, the binder of organic substances, etc. as contained in the PZT layers is removed, and the grain sizes of PZT crystals are enlarged, so that a piezoelectric performance heightens.

Figure 6A:
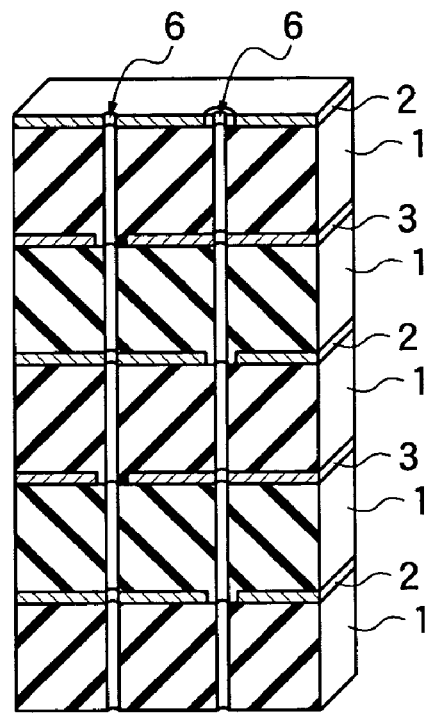
FIGS. 6A and 6B are views for explaining the manufacturing method for the laminated structure according to the first embodiment of the present invention.

Subsequently, at step S6, fine holes 6 each having a diameter of about 30 μm are formed at positions at which they pass through the insulating regions 2a or insulating regions 3a of the laminated piece, as shown in FIG. 6A. The fine holes 6 can be formed in accordance with a known machining method, for example, laser machining which employs a YAG short-pulse laser or the like, ultrasonic needle machining, or drilling. On that occasion, it should be noted to prevent the fine holes 6 from coming into contact with the electrode portions around the insulating regions 2a and 3a. Besides, the fine holes 6 may be formed so as to penetrate the lowermost PZT layer 1 as shown in FIG. 6A, or they may well be formed so as to extend to an intermediate part of the lowermost PZT layer 1 or to the lowermost electrode layers 2 and 3.

Here, in forming the fine holes 6 in the laminated piece, the PZT layers 1 sometimes suffer from damages due to machining heat, stress, etc. In order to eliminate the damages which the PZT layers 1 have suffered from during the formation of the fine holes 6, the laminated piece formed with the fine holes 6 may well be annealed in an atmosphere of about 600° C. to 1000° C. Besides, after the annealing, poling may be performed by applying a DC voltage of 100 V to 1000 V at a temperature of 80° C. to 300° C., whereby piezoelectricity can be recovered.

Figure 6B:
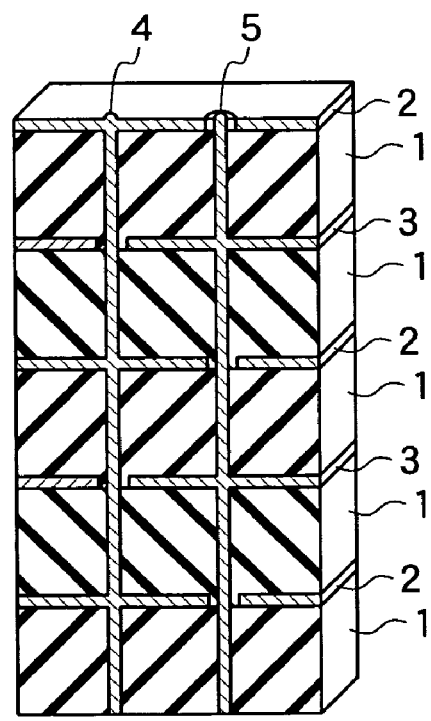

Subsequently, at step S7, the fine holes 6 are filled up with a metal material. A method of filling up the fine holes 6 with the metal material may be a known method such as a method for packing a conductive paste of copper, silver or the like, or a plated through-hole method. Thus, a laminated structure formed with vertical interconnection lines 4 and 5 is fabricated as shown in FIG. 6B.

Further, the PZT layer 1 formed at step S1 may well be removed after the step S7. Thus, the laminated structure 10 shown in FIGS. 1A and 1B can be fabricated. Besides, as in the laminated structure shown in FIG. 2A, the PZT layer 1 may well be used as the protective layer as it is, without removing it.

In this manner, according to this embodiment, the PZT layers and the electrode layers provided with the insulating regions beforehand are stacked, and the vertical interconnection lines are formed from the top surface of the laminated piece so as to alternately pass through the electrode portions and the insulating regions, so that the minute laminated structure in which the pluralities of electrodes are connected in parallel can be manufactured with ease.

Moreover, since the vertical interconnection lines are formed by filling up the fine holes with the metal material, the diameter of each vertical interconnection line can be made small, and consequently, the area of each insulating region can be made small. It is accordingly possible to relieve the damage of the PZT layer attributed to the concentration of stress on the insulating region.

By the way, in this embodiment, in forming the laminated piece at steps S1–S4, the PZT layer has been employed as the lowermost layer, but a material other than the PZT may well be employed as a dummy substrate. In that case, the step S7 in FIG. 4 is followed by the step of removing the dummy substrate, whereby the laminated structure 10 shown in FIGS. 1A and 1B can be fabricated. Alternatively, the dummy substrate may well be employed as a protective layer as it is, without removing it.

Figure 7:
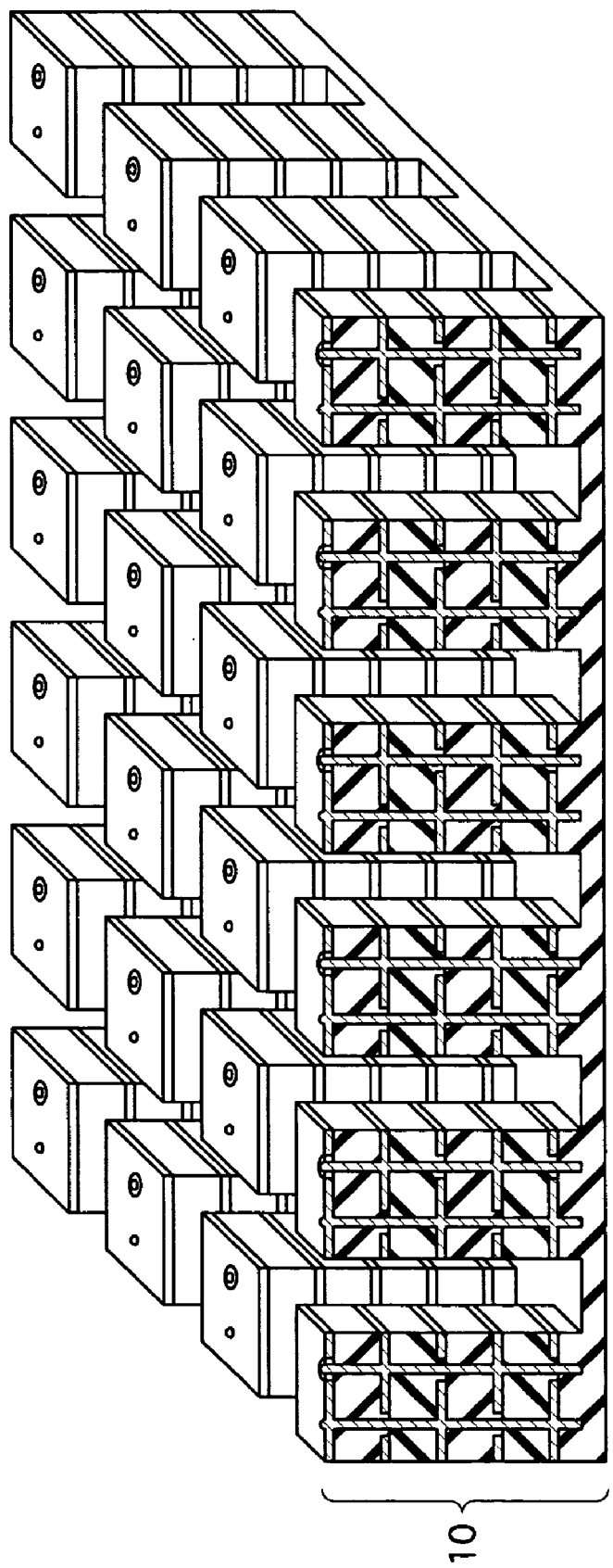
FIG. 7 is a perspective view, partly in section, showing a laminated structure according to the second embodiment of the present invention.

Next, a laminated structure according to the second embodiment of the present invention will be described. FIG. 7 is a perspective view, partly in section, showing the laminated structure according to this embodiment.

As shown in FIG. 7, the laminated structure according to this embodiment includes a plurality of laminated structures 10 which are arrayed in two dimensions. The construction of each laminated structure 10 is similar to that of the laminated structure 10 described with reference to FIGS. 1A and 1B in the first embodiment of the present invention. In the second embodiment, the plurality of laminated structures 10 are arrayed at intervals of, for example, about 0.3 mm.

Here, the shape of each laminated structure 10 is not restricted to a rectangular parallelepiped, but it may be any desired shape such as another square pillar or a cylinder. In a case, for example, where the laminated structure according to this embodiment is employed as an ultrasonic transducer array, the shape of each of the individual laminated structures should desirably be cylindrical. Besides, the array of the plurality of laminated structures is not restricted to the shape of a two-dimensional matrix as shown in FIG. 7, but it may well be, for example, the shape of concentric circles.

Figure 8:
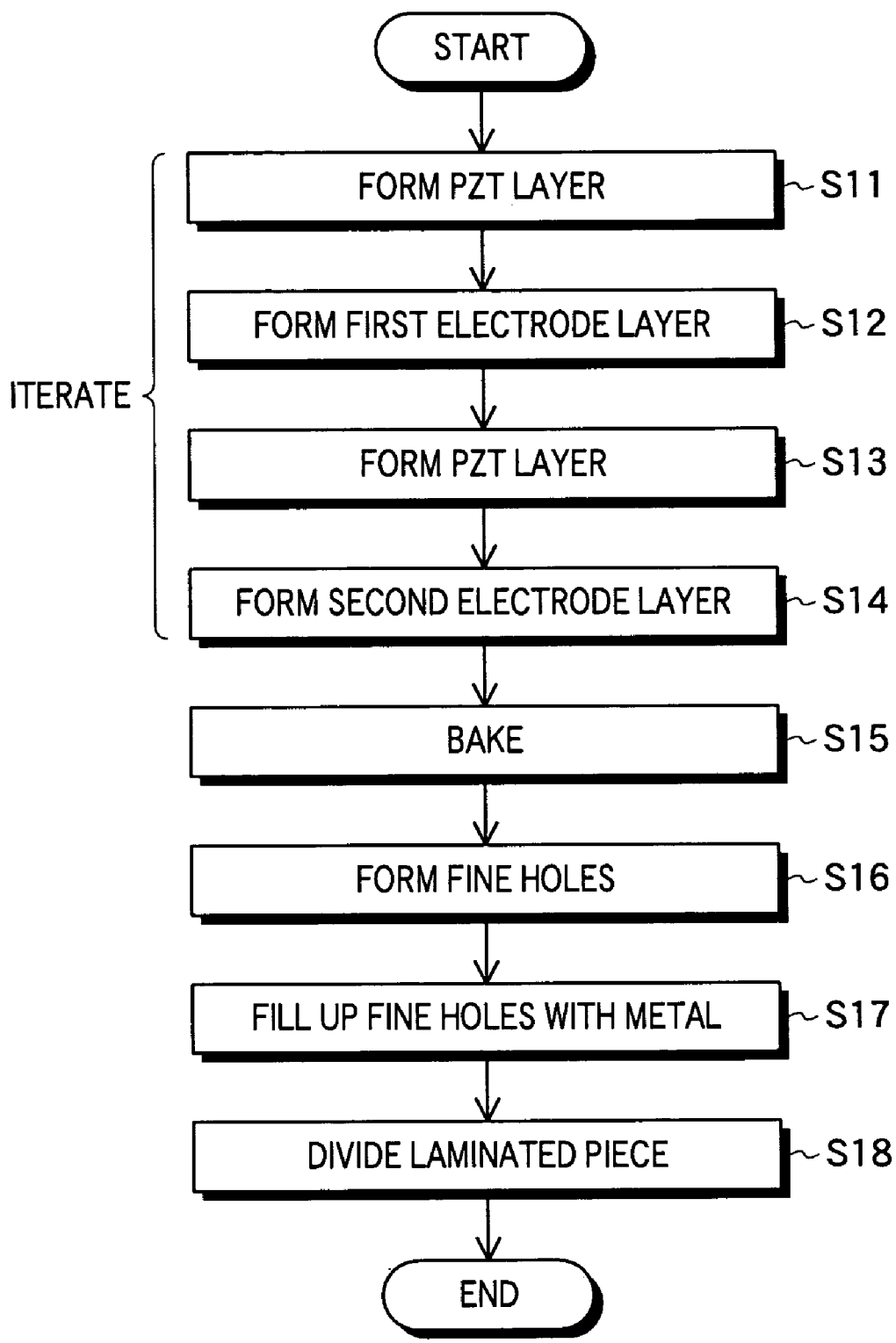
FIG. 8 is a flow chart showing a method of manufacturing the laminated structure according to the second embodiment of the present invention.

A method of manufacturing the laminated structure according to this embodiment will be described with reference to FIG. 8 to FIG. 10C. FIG. 8 is a flow chart showing the manufacturing method for the laminated structure according to this embodiment. Besides, FIG. 9A to FIG. 10C are views for explaining the manufacturing method for the laminated structure according to this embodiment.

Figure 9A:
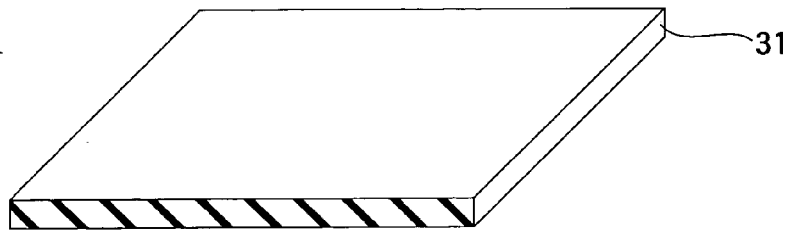
FIGS. 9A–9E are views for explaining the manufacturing method for the laminated structure according to the second embodiment of the present invention.

At step S11 in FIG. 8, a PZT layer 31 is formed by a green sheet method or the like, as shown in FIG. 9A. Incidentally, regarding the lowermost layer of the laminated structure, a material other than PZT may well be employed as a dummy substrate as long as an electrode layer can be formed thereon.

Figure 9B:
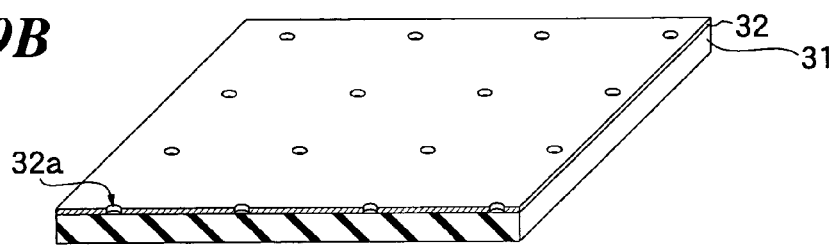

Subsequently, at step S12, as shown in FIG. 9B, a first electrode layer 32 is formed on the region of the PZT layer 31 except a plurality of insulating regions 32a by using a film formation method such as screen printing. A refractory metal material including a metal or an alloy such as nickel (Ni), silver-palladium (Ag—Pd), or platinum (Pt) is used as a material of the electrode layer.

Figure 9C:
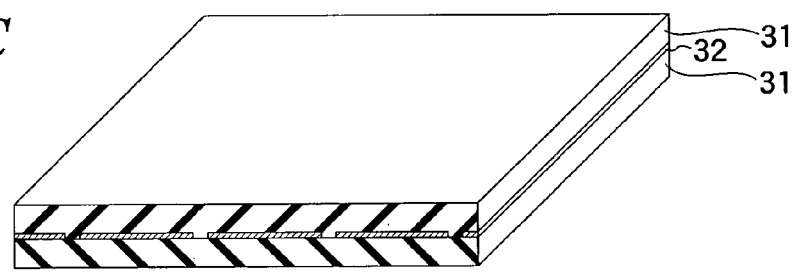
Figure 9D:
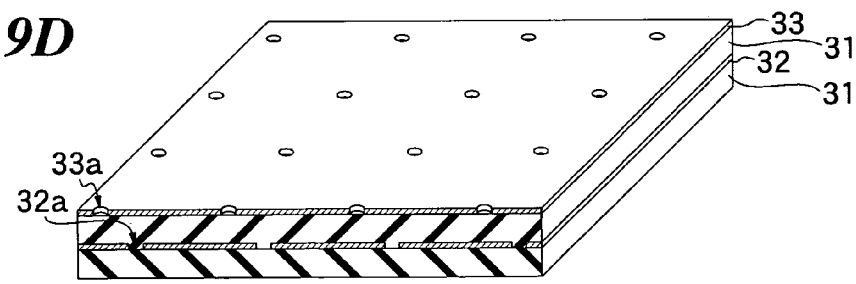

At step S13, a PZT layer 31 is formed on the first electrode layer 32 as shown in FIG. 9C. At the next step S14, as shown in FIG. 9D, a second electrode layer 33 is formed on the region of the PZT layer 31 except for a plurality of insulating regions 33a. Incidentally, film formation methods and materials which are employed at steps S13 and S14 are respectively the same as explained at steps S11 and S12.

Figure 9E:
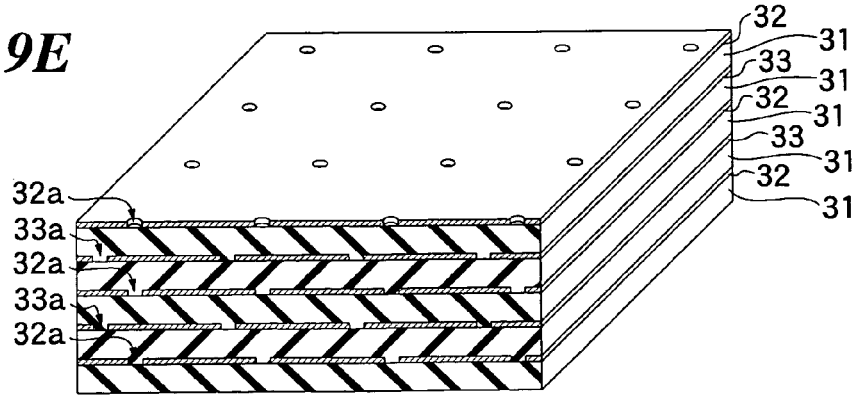

The steps S11–S14 are iterated a desired number of times, whereby a continuous laminated piece is formed as shown in FIG. 9E. Here, the uppermost layer of the laminated piece may be the electrode layer as shown in FIG. 9E, or it may well be the PZT layer. In the case where the uppermost layer is provided as the PZT layer, it can be employed as a protective layer for the electrodes. Besides, in the case where the uppermost layer is provided as the electrode layer, an insulating material may well be packed into the insulating regions 32a, thereby to insulate the electrode layer from a vertical interconnection line which will be formed at a later step.

Subsequently, at step S15, the continuous laminated piece is baked under pressure in an atmosphere of, for example, 800° C. to 1000° C. Thus, a binder contained in the PZT layers is removed, and the grain sizes of PZT crystals are enlarged.

Figure 10A:
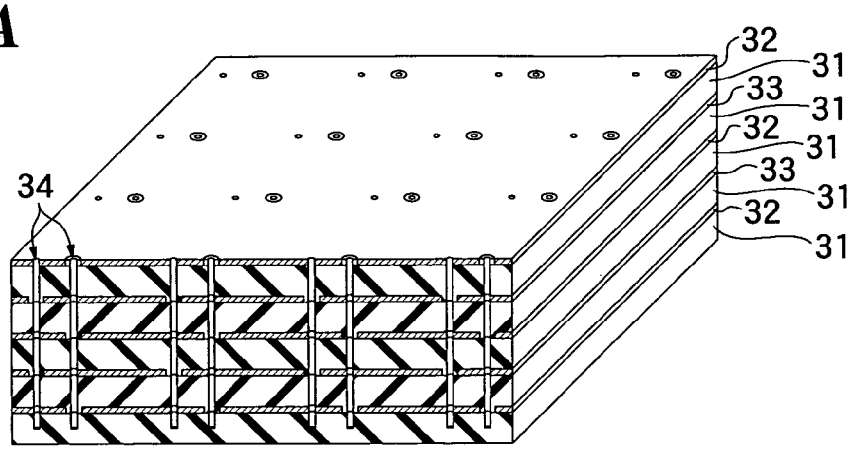
FIGS. 10A–10C are views for explaining the manufacturing method for the laminated structure according to the second embodiment of the present invention.

At step S16, a plurality of fine holes 34 are formed at the central portions of the plurality of insulating regions 32a and the central portions of the plurality of insulating regions 33a, as shown in FIG. 10A. On that occasion, it should be noted to prevent the fine holes 34 from coming into contact with the electrode portions around the insulating regions 32a and 33a. Besides, the fine holes 34 may be formed so as to penetrate the lowermost PZT layer 31 of the continuous laminated piece, or they may well be formed so as to extend to an intermediate part of the lowermost PZT layer 31 or to the lowermost electrode layers 32 and 33.

Here, in forming the fine holes 34 in the laminated piece, the PZT layers 31 sometimes suffer from damages due to machining heat, stress, etc. In order to eliminate the damages which the PZT layers 31 have suffered from during the formation of the fine holes 34, the laminated piece formed with the fine holes 34 may well be annealed in an atmosphere of about 600° C. to 1000° C. Besides, after the annealing, a DC voltage of 100 V to 1000 V is applied for poling at a temperature of 80° C. to 300° C., whereby piezoelectricity can be recovered.

Figure 10B:
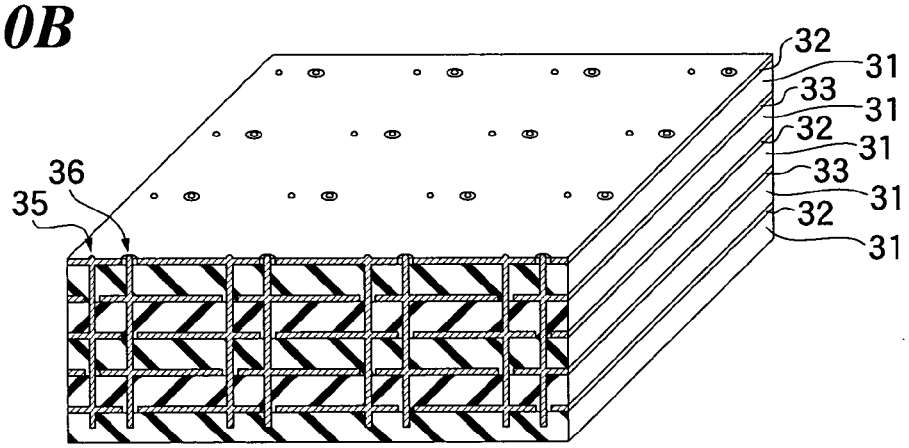

At step S17, the plurality of fine holes 34 are filled up with a metal material by employing a conductive paste, a plated through-hole method, or the like. Thus, two sorts of vertical interconnection lines 35 and 36 are formed as shown in FIG. 10B.

Figure 10C:
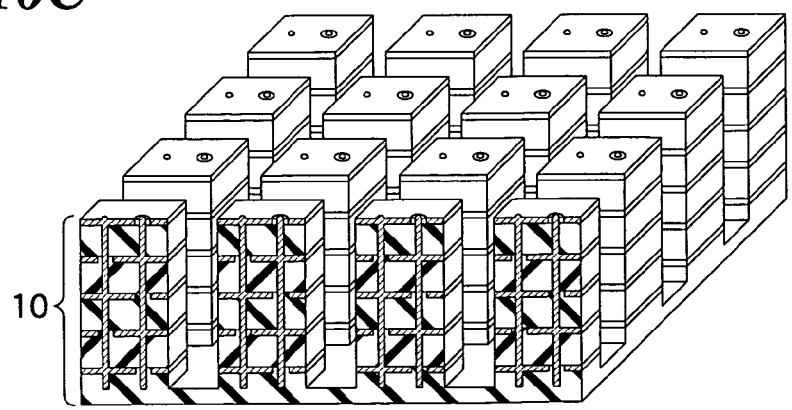

At step S18, the continuous laminated piece is partially divided as shown in FIG. 10C. On that occasion, trenches are provided down to an intermediate part of the lowermost layer of the continuous laminated piece so that the vertical interconnection lines 35 and 36 maybe included in each divided laminated piece, and that individual laminated structures may not be completely separated. Thus, a laminated structure array in which the plurality of laminated structures are arrayed in two dimensions is fabricated. A known machining method such as dicing can be employed as a method for the division. It is also allowed to employ a sand blast method, with which the laminated structures can be divided into any desired shape including a cylinder or a shape having a curved contour. Further, after the step S18, an insulating material such as resin is packed among the plurality of divided laminated structures so as to fix these laminated structures, and part or all of the lowermost PZT layer or a dummy substrate is removed, whereby the laminated piece is separated into a plurality of parts.

In this manner, according to this embodiment, the vertical interconnection lines are formed by forming the fine holes from the top surface of the laminated piece and filling up the fine holes with the metal material, so that the interconnections can be easily formed even in the case where the plurality of laminated structures are arranged in two dimensions.

In this embodiment, the continuous laminated piece has been divided (step S18) after the formation of the vertical interconnection lines 35 and 36 (steps S16 and S17), but the vertical interconnection lines 35 and 36 may well be formed after the division of the laminated piece.

Figure 11:
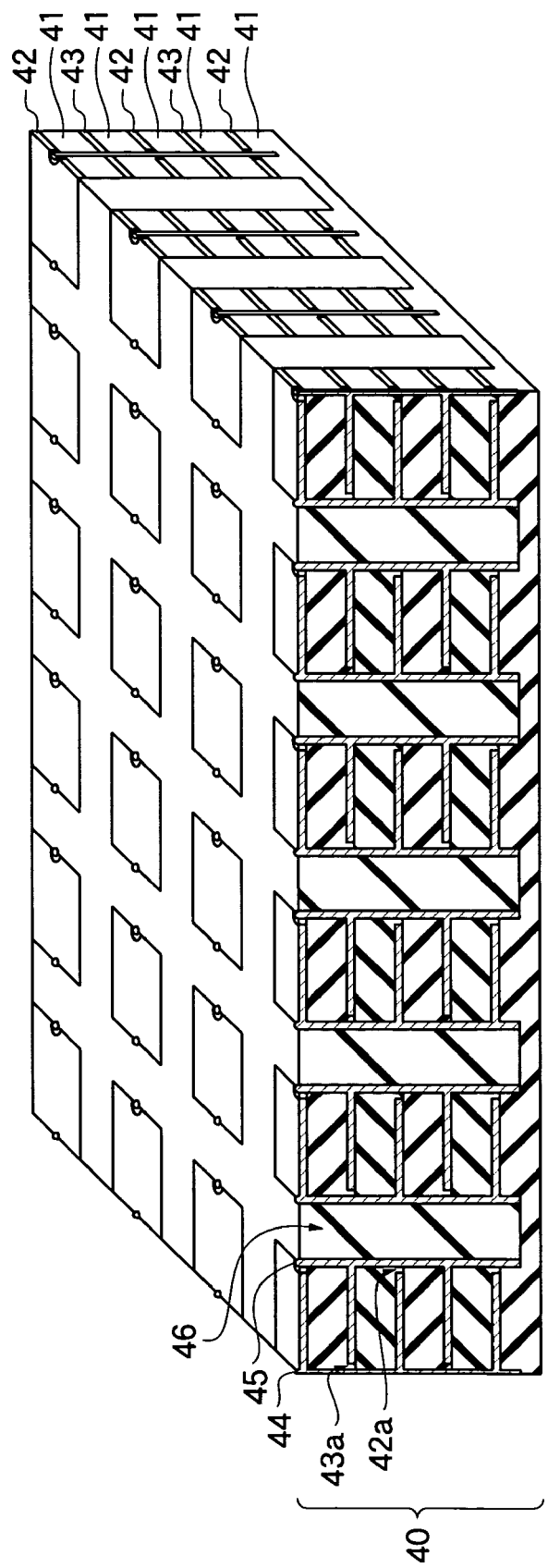
FIG. 11 is a perspective view, partly in section, showing laminated structure according to the third embodiment of he present invention.

Next, a laminated structure according to the third embodiment of the present invention will be described. FIG. 11 is a perspective view, partly in section, showing the laminated structure according to this embodiment.

As shown in FIG. 11, the laminated structure according to this embodiment includes a plurality of laminated structures 40 which are arrayed in two dimensions. An insulating material 46 is packed among the laminated structures 40.

Each of the laminated structures 40 has the positions of insulating regions and vertical interconnection lines altered from those in the laminated structure 10 shown in FIGS. 1A and 1B, and it includes PZT layers 41, first electrode layers 42, second electrode layers 43, and vertical interconnection lines 44 and 45. In the first electrode layers 42 and the second electrode layers 43, insulating regions 42a and 43a are arranged at end portions within the planes of the respective electrode layers. Besides, the vertical interconnection lines 44 and 45 are arranged so as to extend along the edges of the laminated structure 40.

The insulating material 46 supports and protects the laminated structures 40. Used as the insulating material 46 is, for example, a resin material including polyimide, epoxy or urethane, or silicon (Si). Especially in the case where the laminated structure according to this embodiment is employed as an ultrasonic transducer array, in order to reduce the ultrasonic crosstalk among them, ultrasonic waves should desirably be absorbed in such a way that an elastic resin material is packed among the plurality of laminated structures 40.

In this manner, according to this embodiment, the vertical interconnection lines 44 and 45 are arranged so as to extend along the edges of each laminated structure, whereby the areas of the insulating regions 42a and 43a can be made smaller as compared with those in the case of arranging the vertical interconnection lines in the inner parts of the electrode layers. It is accordingly possible to relieve the damage of the PZT layer attributed to the concentration of stress on the insulating region.

Figure 12:
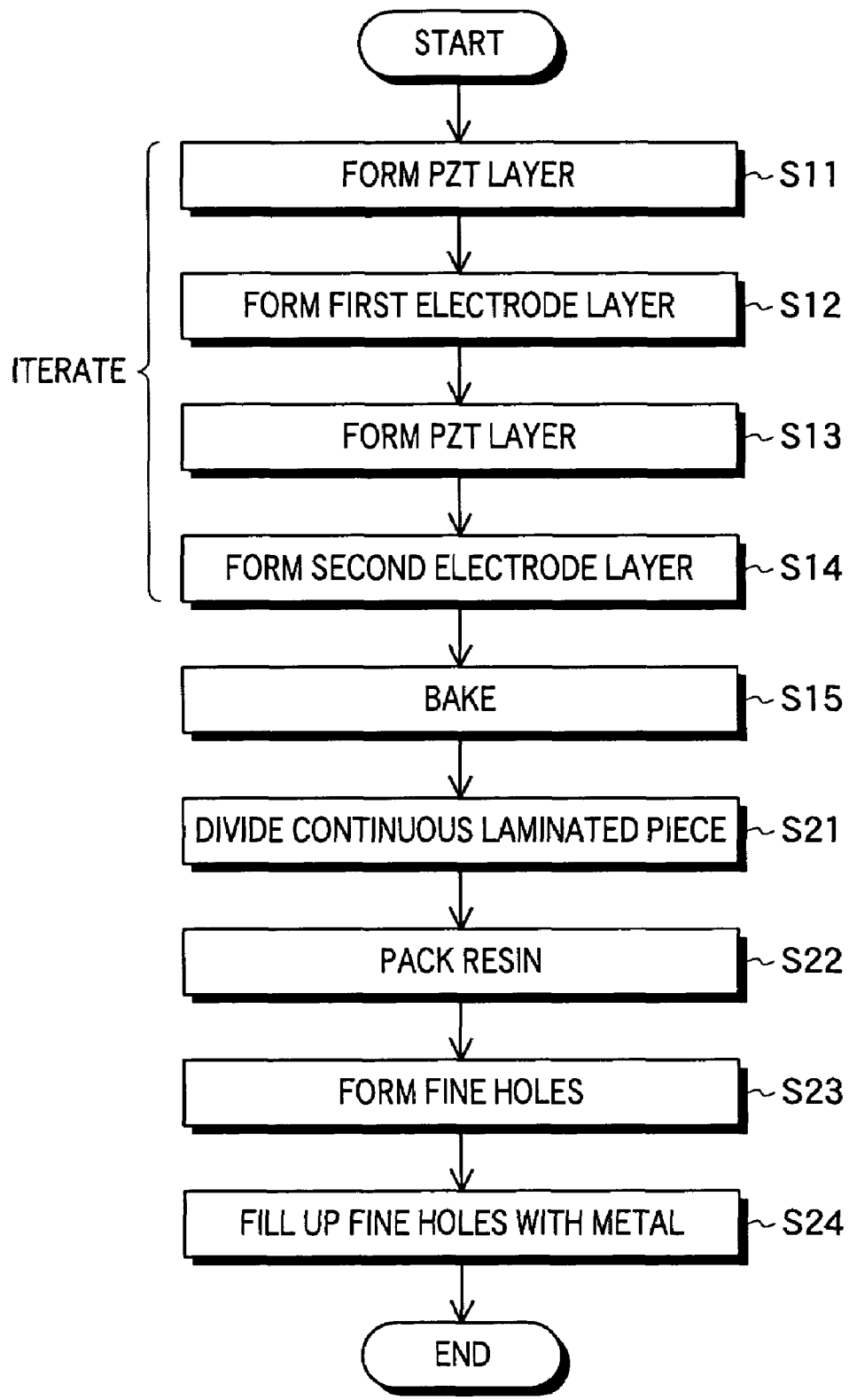
FIG. 12 is a flow chart showing a method of manufacturing the laminated structure according to the third embodiment of the present invention.

A method of manufacturing the laminated structure according to the third embodiment of the present invention will be described with reference to FIG. 12 to FIG. 13D. FIG. 12 is a flow chart showing the manufacturing method for the laminated structure according to this embodiment. Besides, FIGS. 13A–13D are views for explaining the manufacturing method for the laminated structure according to this embodiment.

Figure 13A:
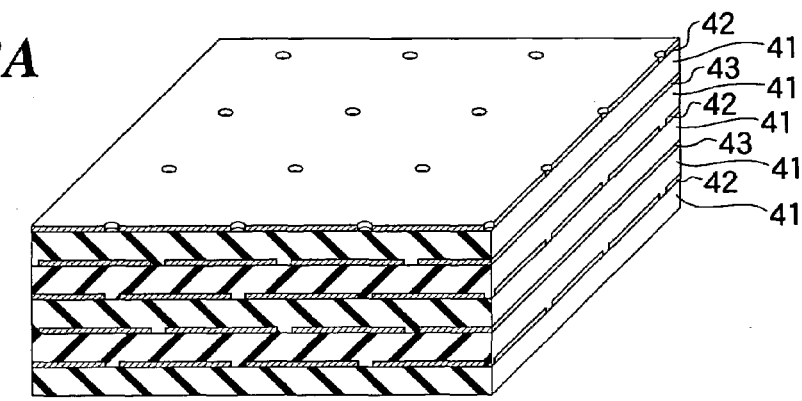
FIGS. 13A–13D are views for explaining the manufacturing method for the laminated structure according to the third embodiment of the present invention.

At steps S11–S14 in FIG. 12, a PZT layer 41, a first electrode layer 42, a PZT layer 41 and a second electrode layer 43 are successively and iteratively stacked, thereby to form a continuous laminated piece as shown in FIG. 13A. Subsequently, at step S15, the continuous laminated piece is baked under pressure in an atmosphere of 800° C. to 1000° C. Incidentally, the details of processes at steps S11–S15 are the same as described in the second embodiment of the present invention.

Figure 13B:
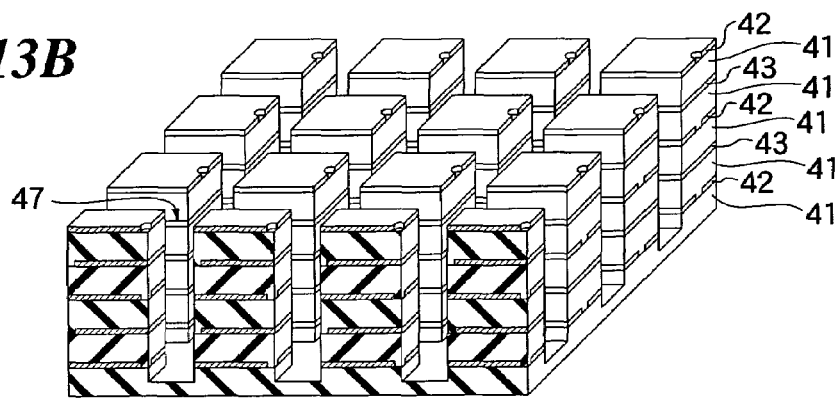

Subsequently, at step S21, the continuous laminated piece is partially divided as shown in FIG. 13B, by forming trenches 47 so as to pass through a plurality of insulating regions 42a or a plurality of insulating regions 43a. On that occasion, the trenches 47 are provided down to the intermediate parts of the lowermost layer of the continuous laminated piece as shown in FIG. 13B without completely separating individual laminated structures. A machining method such as dicing or a sand blast method is employed as a method for forming the trenches 47.

Figure 13C:
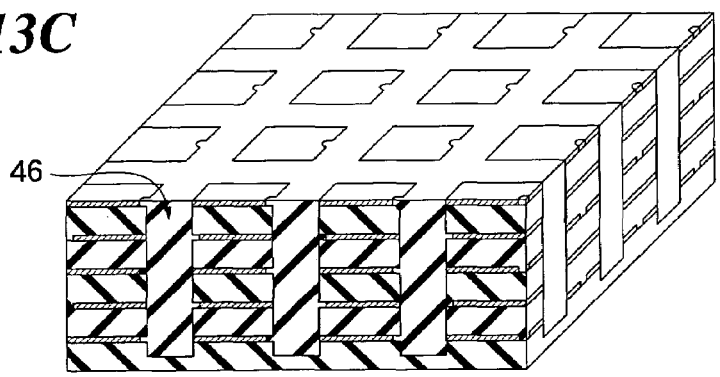
Figure 13D:
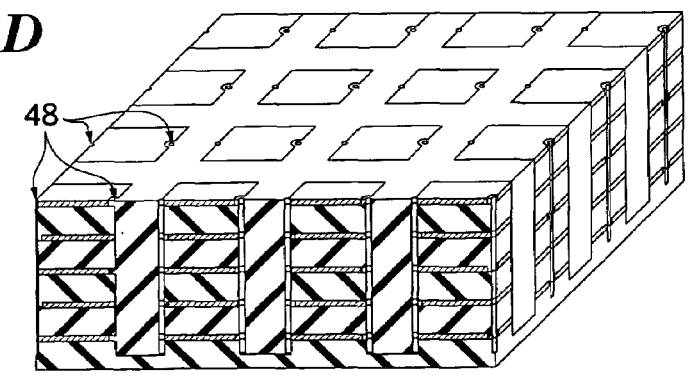
Figure 14:
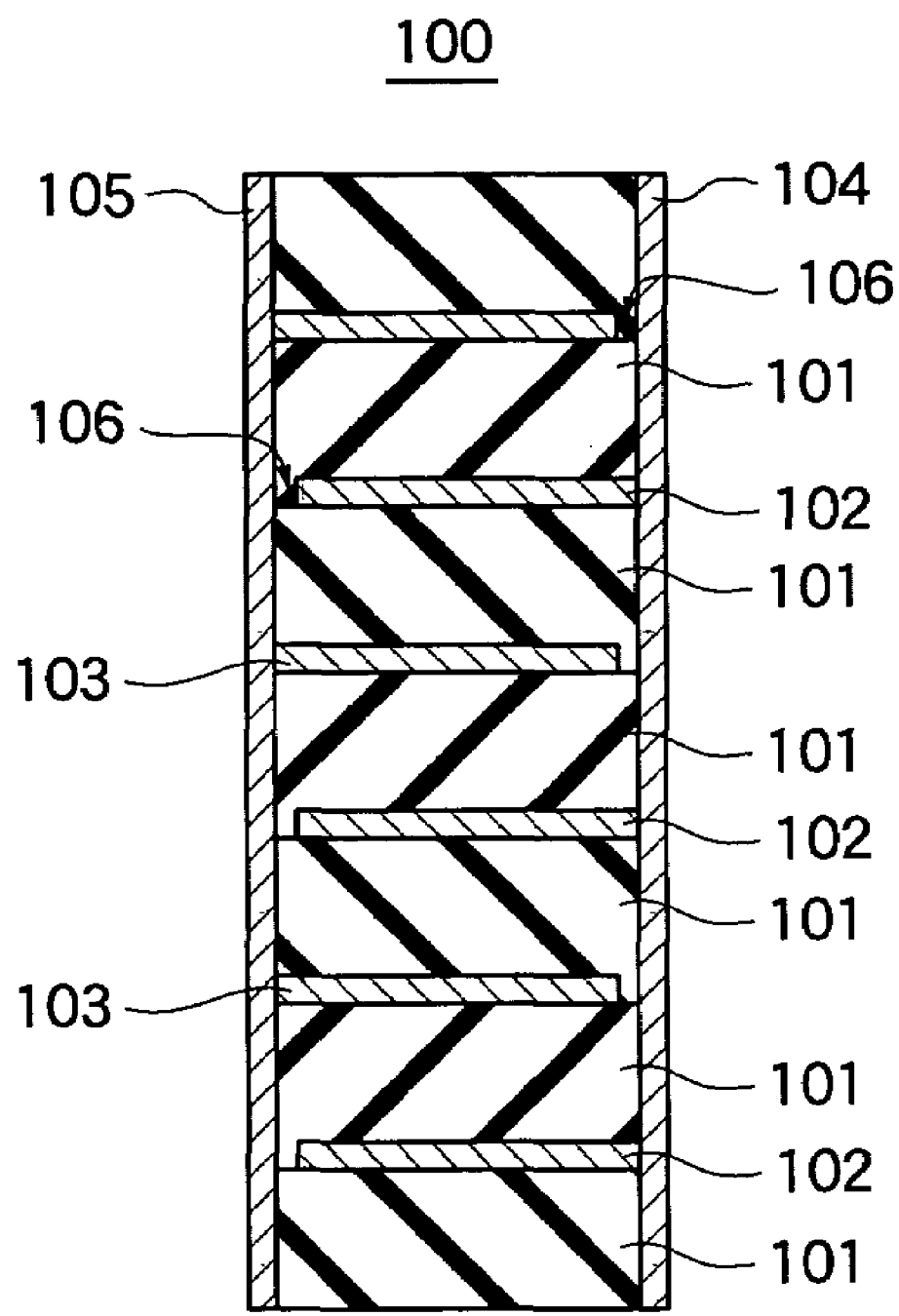
FIG. 14 is a view for explaining an interconnection method in a conventional laminated structure.

At step S22, an insulating material such as resin 46 is packed into the trenches 47 as shown in FIG. 13C. Thus, the plurality of divided laminated structures are fixed.

At step S23, a plurality of fine holes 48 are formed so as to pass through the boundaries between the laminated structures and the insulating material 46 at positions which correspond to the plurality of insulating regions 42a or the plurality of insulating regions 43a, as shown in FIG. 13D. On that occasion, it should be noted to prevent the fine holes 48 from coming into contact with the electrode portions around the insulating regions. 42a and 43a.

At step S24, the plurality of fine holes 48 are filled up with a metal material by employing a conductive paste, a plated through-hole method, or the like. When vertical interconnection lines 44 and 45 are formed in this way, the laminated structure shown in FIG. 11 is fabricated.

As explained above, in this embodiment, the fine holes are formed so as to pass through the boundaries between the laminated structures and the insulating material, whereby the vertical interconnection lines are laid along the edges of the individual laminated structures. Since the insulating material such as resin is soft as compared with the PZT layers and electrode layers included in the laminated structures, the fine holes can be easily formed by arranging their greater parts on the side of the insulating material. Moreover, since the areas of the insulating regions for insulating the vertical interconnection lines can be made still smaller, the damage of the PZT layer attributed to stress concentration on the insulating region can be greatly relieved.

As thus far described, according to the present invention, interconnections are formed by forming fine holes from the top surface of a laminated piece in which piezoelectric material layers and electrode layers are stacked, and then filling up the fine holes with a metal material, so that a laminated structure in which the plurality of electrode layers are connected in parallel can be fabricated with ease. Especially, even in an array having a plurality of laminated structures arrayed in two dimensions, interconnections can be easily formed by a similar method. Moreover, the areas of insulating regions provided in the electrode layers can be made small, so that the damage of the piezoelectric material layer attributed to the concentration of stress on the insulating region can be relieved.

The invention claimed is:

1. A laminated structure comprising:
   a laminated piece having a plurality of piezoelectric material layers and a plurality of electrode layers stacked in a predetermined sequence, said plurality of electrode layers including a first electrode layer provided with a first insulating region and a second electrode layer provided with a second insulating region at a position different from that of the first insulating region;
   a first interconnection line electrically connected to the first electrode layer while passing through the second insulating region provided in the second electrode layer; and
   a second interconnection line electrically connected to the second electrode layer while passing through the first insulating region provided in the first electrode layer,
   wherein said laminated piece further has at least one of a piezoelectric material layer provided as a lowermost layer and a piezoelectric material layer provided as an uppermost layer, and
   wherein at least one of the first and second interconnection lines extends to an intermediate part of either one of the piezoelectric material layer disposed as the lowermost layer and the piezoelectric material layer disposed as the uppermost layer.

2. A laminated structure according to claim 1, wherein said at least one of the piezoelectric material layer disposed as the lowermost layer and the piezoelectric material layer disposed as the uppermost layer is thicker than each of said plurality of piezoelectric material layers.

3. A laminated structure according to claim 1, wherein each of said first and second interconnection lines has a diameter of not larger than 30 µm.

4. A laminated structure comprising:
   a laminated piece having a plurality of piezoelectric material layers and a plurality of electrode layers stacked in a predetermined sequence, said plurality of electrode layers including a first electrode layer provided with a first insulating region and a second electrode layer provided with a second insulating region at a position different from that of the first insulating region;
   a first interconnection line electrically connected to the first electrode layer while passing through the second insulating region provided in the second electrode layer; and
   a second interconnection line electrically connected to the second electrode layer while passing through the first insulating region provided in the first electrode layer,
   wherein at least one of the first and second interconnection lines is formed to extend along an edge of said laminated piece.

5. A laminated structure according to claim 4, wherein the first and second interconnection lines are formed of a metal material with which through-holes formed in said laminated piece are filled up.

6. A laminated structure according to claim 4, wherein each of said first and second interconnection lines has a diameter of not larger than 30 µm.

7. A laminated structure according to claim 4, wherein said laminated piece further has at least one of a piezoelectric material layer provided as a lowermost layer and a piezoelectric material layer provided as an uppermost layer.

8. A laminated structure comprising:
a plurality of laminated pieces arrayed in two dimensions, each of said plurality of laminated pieces having a plurality of piezoelectric material layers and a plurality of electrode layers stacked in a predetermined sequence, said plurality of electrode layers including a first electrode layer provided with a first insulating region and a second electrode layer provided with a second insulating region at a position different from that of the first insulating region;
a first plurality of interconnection lines each electrically connected to the first electrode layer while passing through the second insulating region provided in the second electrode layer; and
a second plurality of interconnection lines each electrically connected to the second electrode layer while passing through the first insulating region provided in the first electrode layer, and
an insulating material packed among said plurality of laminated pieces,
wherein at least ones of said first plurality of interconnection lines and said second plurality of interconnection lines are disposed to pass through boundaries between said insulating material and said plurality of laminated pieces.

9. A method of manufacturing a laminated structure, said method comprising the steps of:
(a) forming a laminated piece by stacking a plurality of piezoelectric material layers and a plurality of electrode layers in a predetermined sequence, said plurality of electrode layers including a first electrode layer provided with a first insulating region and a second electrode layer provided with a second insulating region at a position different from that of the first insulating region;
(b) forming, after step (a), at least one through-hole to penetrate the first electrode layer while passing through the second insulating region provided in the second electrode layer;
(c) forming, after step (a), at least one through-hole to penetrate the second electrode layer while passing through the first insulating region provided in the first electrode layer; and
(d) filling up the through-holes formed at steps (b) and (c) with a metal material to form at least one interconnection line electrically connected to the first electrode layer and at least one interconnection line electrically connected to the second electrode layer.

10. A method of manufacturing a laminated structure, said method comprising the steps of:
(a) forming a laminated piece by stacking a plurality of piezoelectric material layers and a plurality of electrode layers in a predetermined sequence, said plurality of electrode layers including a first electrode layer provided with a first group of insulating regions and a second electrode layer provided with a second group of insulating regions at positions different from those of the first group of insulating regions;
(b) forming a plurality of through-holes to penetrate the first electrode layer while respectively passing through the second group of insulating regions provided in the second electrode layer;
(c) forming a plurality of through-holes to penetrate the second electrode layer while respectively passing through the first group of insulating regions provided in the first electrode layer;
(d) filling up the pluralities of through-holes formed at steps (b) and (c) with a metal material to form a plurality of interconnection lines electrically connected to the first electrode layer and form a plurality of interconnection lines electrically connected to the second electrode layer;
(e) forming at least one trench in said laminated piece to partially divide said laminated piece; and
(f) packing an insulating material into said at least one trench formed at step (e).

11. A method of manufacturing a laminated structure according to claim 10, further comprising the step of:
cutting said laminated piece to separate said laminated piece into a plurality of parts to be held by the insulating material.

12. A method of manufacturing a laminated structure, said method comprising the steps of:
(a) forming a laminated piece by stacking a plurality of piezoelectric material layers and a plurality of electrode layers in a predetermined sequence, said plurality of electrode layers including a first electrode layer provided with a first group of insulating regions and a second electrode layer provided with a second group of insulating regions at positions different from those of the first group of insulating regions;
(b) forming at least one trench in said laminated piece to partially divide said laminated piece;
(c) packing an insulating material into said at least one trench formed at step (b);
(d) forming a plurality of through-holes to respectively pass through boundaries between the insulating material and the divided first electrode layers and boundaries between the insulating material and the second group of insulating regions provided in the divided second electrode layers;
(e) forming a plurality of through-holes to respectively pass through boundaries between the insulating material and the divided second electrode layers and boundaries between the insulating material and the first group of insulating regions provided in the divided first electrode layers; and
(f) filling up the pluralities of through-holes formed at steps (d) and (e) with a metal material to form a plurality of interconnection lines electrically connected to the divided first electrode layers respectively and form a plurality of interconnection lines electrically connected to the divided second electrode layers respectively.

13. A method of manufacturing a laminated structure according to claim 12, further comprising the step of:
cutting said laminated piece to separate said laminated piece into a plurality of parts to be held by the insulating material.

* * * * *